United States Patent
Aronson et al.

(10) Patent No.: US 7,068,522 B2
(45) Date of Patent: Jun. 27, 2006

(54) EMI CONTAINMENT TRANSCEIVER MODULE WITH FLOATING PCB

(75) Inventors: Lewis B. Aronson, Los Altos, CA (US); Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 296 days.

(21) Appl. No.: 10/831,595

(22) Filed: Apr. 23, 2004

(65) Prior Publication Data

US 2004/0198079 A1 Oct. 7, 2004

Related U.S. Application Data

(62) Division of application No. 10/425,090, filed on Apr. 28, 2003.
(60) Provisional application No. 60/419,444, filed on Oct. 17, 2002.

(51) Int. Cl.
*H05K 9/00* (2006.01)

(52) U.S. Cl. .................................. 361/818; 361/816
(58) Field of Classification Search ................ 361/728, 361/730, 732, 736, 737, 740, 741, 742, 747, 361/748, 752, 753, 756, 758, 759, 799, 800, 361/801, 802, 816, 818; 174/35 R, 35 GC, 174/52, 50, 50.51, 50.52; 211/41.17; 439/607, 439/609

See application file for complete search history.

(56) References Cited

U.S. PATENT DOCUMENTS

| | | | | | |
|---|---|---|---|---|---|
| 4,831,498 | A | * | 5/1989 | Baba ........................... | 361/816 |
| 5,160,807 | A | * | 11/1992 | Fry et al. ................... | 174/35 R |
| 5,323,299 | A | * | 6/1994 | Weber ......................... | 361/818 |
| 5,335,147 | A | * | 8/1994 | Weber ......................... | 361/818 |
| 5,430,618 | A | * | 7/1995 | Huang ......................... | 361/818 |
| 5,495,358 | A | * | 2/1996 | Bartig et al. ................. | 398/202 |
| 5,777,856 | A | | 7/1998 | Philips et al. ............... | 361/816 |
| 6,137,689 | A | * | 10/2000 | Schechtel et al. ........... | 361/759 |
| 6,239,973 | B1 | * | 5/2001 | Taylor et al. ................ | 361/704 |
| 6,431,764 | B1 | | 8/2002 | Scharf et al. ................ | 385/88 |
| 6,483,711 | B1 | * | 11/2002 | Huang ......................... | 361/736 |
| 6,497,588 | B1 | | 12/2002 | Scharf et al. ................ | 439/607 |
| 2002/0131122 | A1 | | 9/2002 | Anderi et al. ............... | 359/152 |

* cited by examiner

*Primary Examiner*—Phuong T. Vu
(74) *Attorney, Agent, or Firm*—Workman Nydegger (57) ABSTRACT

An electronic module is provided that includes a housing having electrically conductive top and bottom housing portions in substantial contact with each other and cooperating with each other to define an opening. A printed circuit board is disposed within the housing and includes an edge connector at least partially extending through the opening in the housing. The printed circuit board also defines a nonconductive through opening configured and arranged so that the housing portions contact each other by way of the through opening. In this way, the housing portions cooperate to subdivide the opening defined by the housing into at least two relatively smaller openings that, as a result of their relatively small size, facilitate containment of electromagnetic emissions generated by the electronic module.

21 Claims, 10 Drawing Sheets

EMI CONTAINMENT TRANSCEIVER MODULE WITH FLOATING PCB

CROSS-REFERENCE TO RELATED APPLICATIONS

This application is a division, and claims the benefit, of U.S. patent application Ser. No. 10/425,090, entitled ELECTROMAGNETIC INTERFERENCE CONTAINMENT TRANSCEIVER MODULE, filed Apr. 28, 2003, which, in turn, claims the benefit of U.S. Provisional Patent Application No. 60/419,444, filed Oct. 17, 2002. Both of the aforementioned applications are incorporated herein in their respective entireties by this reference.

BACKGROUND OF THE INVENTION

1. Field of the Invention

The present invention generally relates to optical modules. More particularly, exemplary embodiments of the invention concern an optical module that includes EMI control structures configured to interact with each other by way of through openings defined in a PCB of the optical module.

2. Related Technology

Fiber optics are increasingly used for transmitting voice and data signals. As a transmission medium, light provides a number of advantages over traditional electrical communication techniques. For example, light signals allow for extremely high transmission rates and very high bandwidth capabilities. Also, light signals are resistant to electromagnetic interferences that would otherwise interfere with electrical signals. Light also provides a more secure signal because it doesn't allow portions of the signal to escape from the fiber optic cable as can occur with electrical signals in wire-based systems. Light also can be conducted over greater distances without the signal loss typically associated with electrical signals on copper wire.

While optical communications provide a number of advantages, the use of light as a transmission medium presents a number of implementation challenges. In particular, the data carried by a light signal must be converted to an electrical format when received by a device, such as a network switch. Conversely, when data is transmitted to the optical network, it must be converted from an electronic signal to a light signal. A number of protocols define the conversion of electrical signals to optical signals and transmission of those optical, including the ANSI Fibre Channel (FC) protocol. The FC protocol is typically implemented using a transceiver module at both ends of a fiber optic cable. Each transceiver module typically contains a laser transmitter circuit capable of converting electrical signals to optical signals, and an optical receiver capable of converting received optical signals back into electrical signals.

Typically, a transceiver module is electrically interfaced with a host device—such as a host computer, switching hub, network router, switch box, computer I/O and the like—via a compatible connection port. Moreover, in some applications it is desirable to miniaturize the physical size of the transceiver module to increase the port density, and therefore accommodate a higher number of network connections within a given physical space. In addition, in many applications, it is desirable for the module to be hot-pluggable, which permits the module to be inserted and removed from the host system without removing electrical power. To accomplish many of these objectives, international and industry standards have been adopted that define the physical size and shape of optical transceiver modules to insure compatibility between different manufacturers. For example, in 2000, a group of optical manufacturers developed a set of standards for optical transceiver modules called the Small Form-factor Pluggable ("SFP") Transceiver Multi-Source Agreement ("MSA"), incorporated herein by reference. In addition to the details of the electrical interface, this standard defines the physical size and shape for the SFP transceiver modules, and the corresponding host port, so as to insure interoperability between different manufacturers' products. There have been several subsequent standards, and proposals for new standards, including the XFP MSA for 10 Gigabit per second modules using a serial electrical interface, that also define the form factors and connection standards for pluggable optoelectronic modules, such as the published draft version 0.92 (XFP MSA), incorporated herein by reference.

As optical transmission speed provided by electronic modules increases, additional problems arise. For example, electronic devices and components operating at high frequencies typically emit signals referred to as electromagnetic interference. This electromagnetic interference, referred to as "EMI", is electrical noise in the form of an electromagnetic wave. The phenomenon is undesirable because EMI can interfere with the proper operation of other electrical components. Optical transceiver packages, especially those operating at high transmission speeds, are especially susceptible to emitting EMI. In particular, the physical configuration of existing transceiver modules does a poor job of containing EMI—especially as the generating speed of the module increases. For example, as is shown in FIGS. 7A through 8C, a transceiver module 8 typically includes a housing 5 that contains a printed circuit board 10 and associated electrical and optical components. However, the housing 5 does not completely enclose the printed circuit board 10. Instead, a portion of the printed circuit board 10 is formed as an edge connector 12. The edge connector 12 includes a number of high speed traces for communicating signals to and from the electrical contacts on the edge connector 12. In operation, the edge connector 12 is capable of electrically and physically interfacing with a corresponding host connector 702 that is positioned on a host board 700.

Figures 6A, 6B:
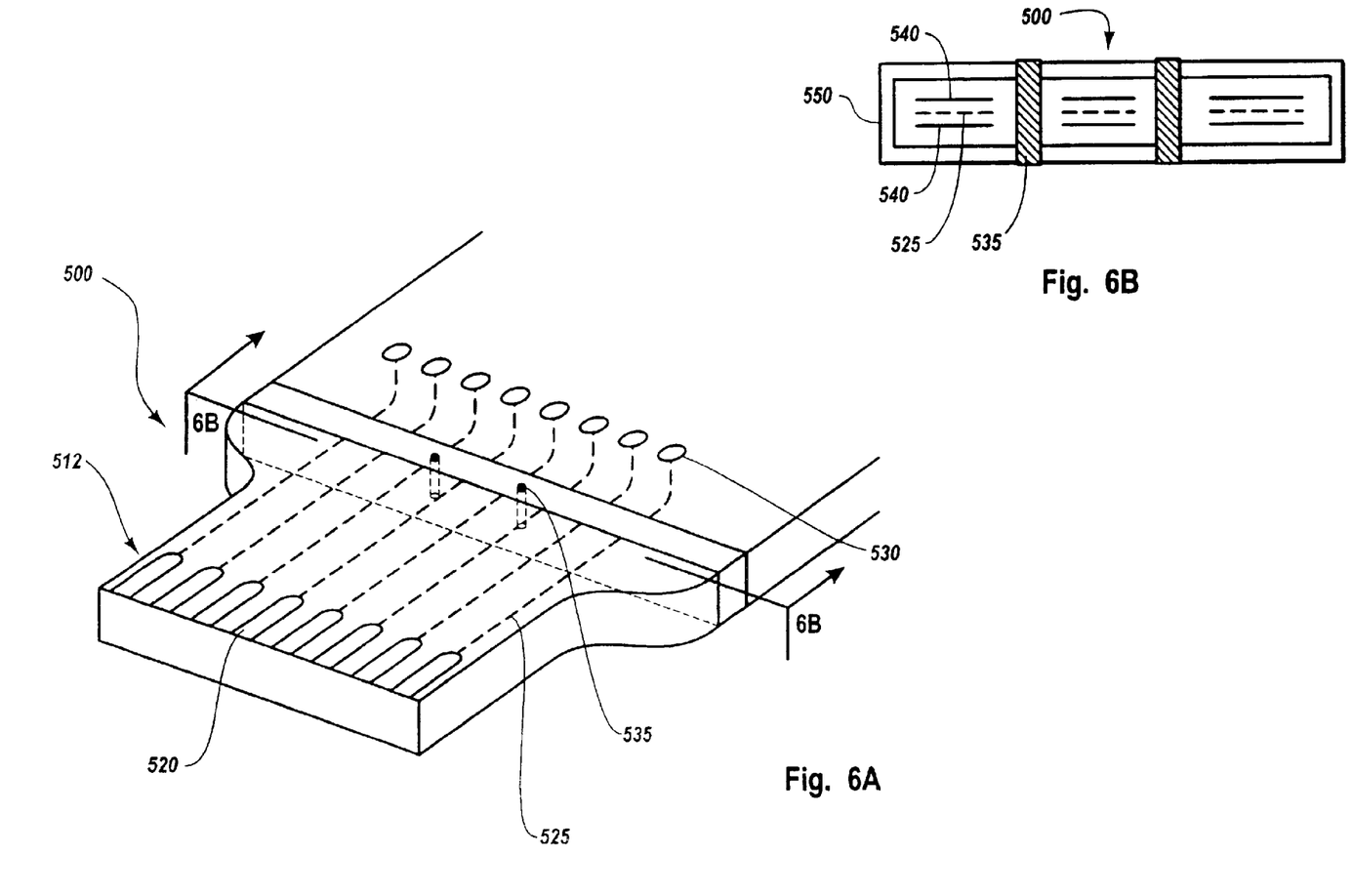
FIG. 6A illustrates a perspective view of a printed circuit board portion in accordance with yet another alternative embodiment of the present invention.
FIG. 6B illustrates a cutaway rear view of a printed circuit board taken along lines 6B in FIG. 6A.
Figure 7A:
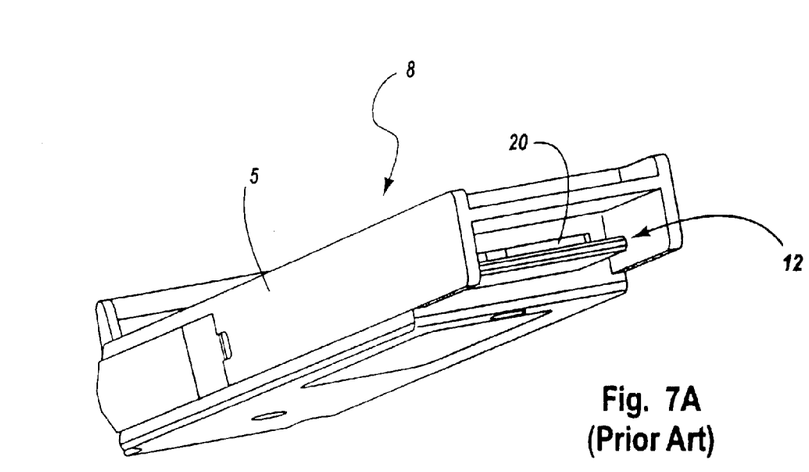
Figure 7B:
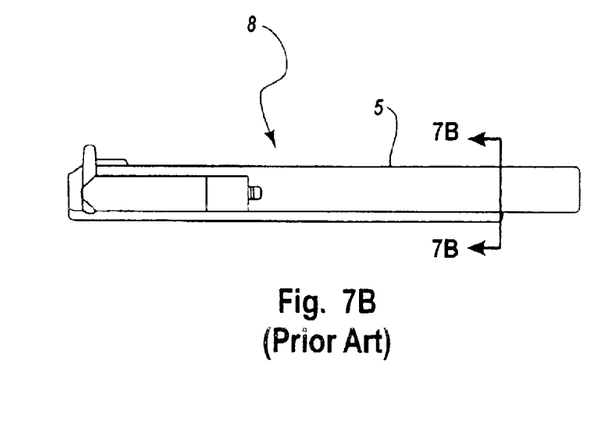
Figure 7C:
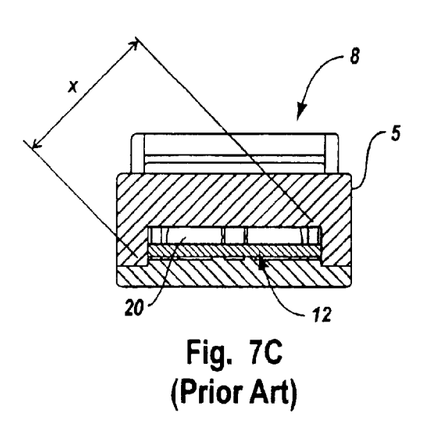
Figure 7D:
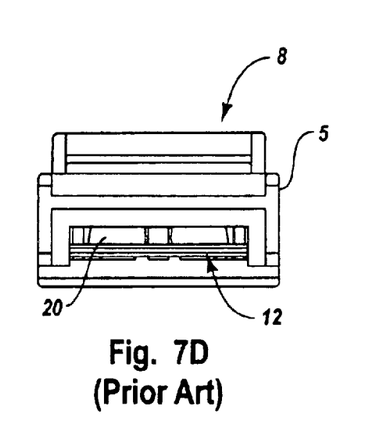

Thus, in order for the edge connector 12 to be exposed externally to the module, the module housing 5 must provide an opening, shown at 20 in FIG. 6B. Moreover, insofar as the housing 5 is typically constructed of a conductive material, the opening 20 typically provides a minimum clearance area (the diagonal dimension of which is represented as "X" in FIG. 6B), so as to not electrically interfere with the high speed traces on the edge connector portion of the board 10. Unfortunately, this opening 20 also allows for the emission of an unacceptable amount if EMI; the emission is especially problematic as transmission speeds increase.

Therefore, there is a need in the industry for a pluggable module, such as an optoelectronic transceiver module, that is configured so as to minimize the emission of EMI. Preferably, the module configuration could be used in environments having high frequency data signal transmissions. Moreover, the module configuration should not affect the data signal integrity or the speed capabilities of the module. In addition, the electronic module should be implemented in a manner that meets existing standard form factors. Preferably, the module should maintain the ability to properly dissipate heat from the components inside the module.

BRIEF SUMMARY OF AN EXEMPLARY EMBODIMENT OF THE INVENTION

Briefly summarized, exemplary embodiments of the present invention are directed to an optical transceiver module for use in optical communications networks. One exemplary embodiment of the optical transceiver substantially conforms with the Small Form Factor Pluggable ("SFP") standard and is configured for use with high data rate systems.

The aforementioned exemplary optical transceiver includes a housing having top and bottom portions and enclosing a printed circuit board ("PCB"). The PCB includes a variety of electronic components disposed on its surface, as well as a connector portion formed at one end of the PCB that partially extends beyond portions of the housing. The edge of the connector portion includes a plurality of conductive traces that interconnect with traces of a host system, such as a computer, signal router, or other input/output device, when the transceiver module is interfaced with the host system.

In addition, the PCB defines one or more non-conductive through holes configured and arranged to allow a part of one of the housing portions to pass through the PCB and contact the other housing portion. In this way, an EMI control structure is defined that facilitates a relative improvement in the containment of electromagnetic waves generated by the transceiver and, accordingly, contributes to a reduction in EMI associated with transceiver operations. These and other aspects of the present invention will become more fully apparent from the following description and appended claims.

BRIEF DESCRIPTION OF THE DRAWINGS

In order that the manner in which the above recited and other advantages and features of the invention are obtained, a more particular description of the invention briefly described above will be given by making reference to a specific embodiment that is illustrated in the appended drawings. These drawings depict only a few embodiments of the invention and are not to be considered limiting of its scope:

FIGS. 7A–8C show various exemplary views of prior art modules.

DETAILED DESCRIPTION OF EXEMPLARY EMBODIMENTS

Reference will now be made to the drawings to describe exemplary embodiments of the invention. It is to be understood that the drawings are diagrammatic and schematic representations of such embodiments, and are not limiting of the present invention, nor are they necessarily drawn to scale.

In general, the present invention relates to an electronic pluggable module that is structured in a manner that minimizes the emission of potentially harmful EMI waves. In preferred embodiments, the module maintains a low profile, and conforms with the physical dimensions set forth by existing industry standards. In addition, EMI shielding is provided in a manner that does not interfere with the electronic performance of the module. Likewise, the module is constructed so as to dissipate heat efficiently and thereby avoid overheating of the electrical or optical components. Although the preferred embodiments are described in the context of an optoelectronic transceiver module, it will be appreciated that teachings of the present invention can be used in the context of other environments, including other electrical pluggable modules.

Figure 1A:
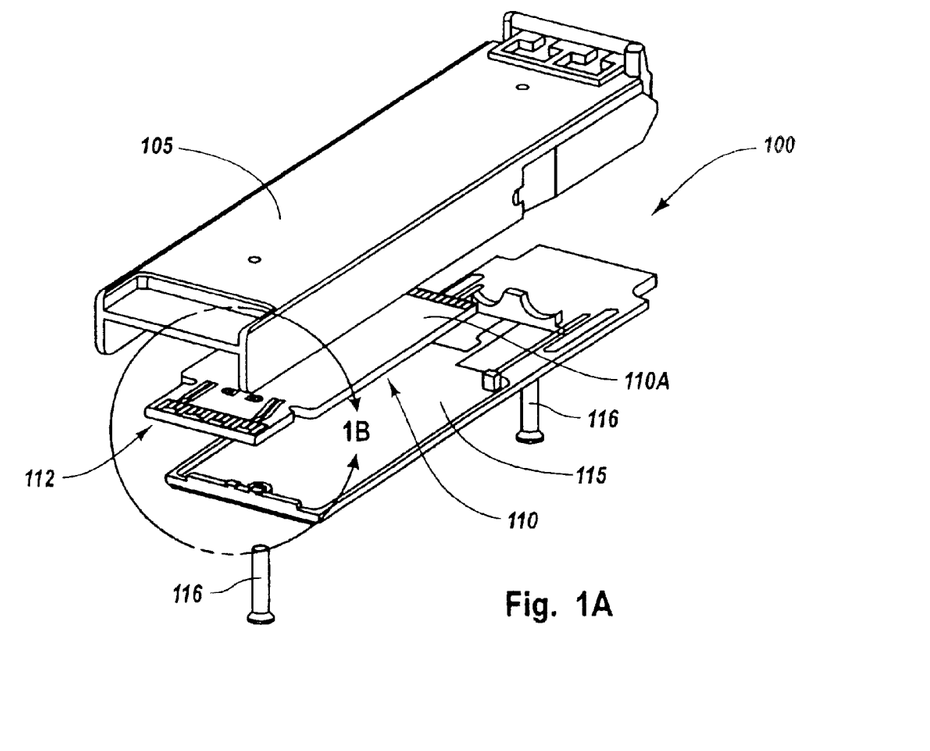
FIG. 1A is an exploded perspective view of a transceiver module configured to contain EMI waves in accordance with one embodiment of the present invention.
Figure 1B:
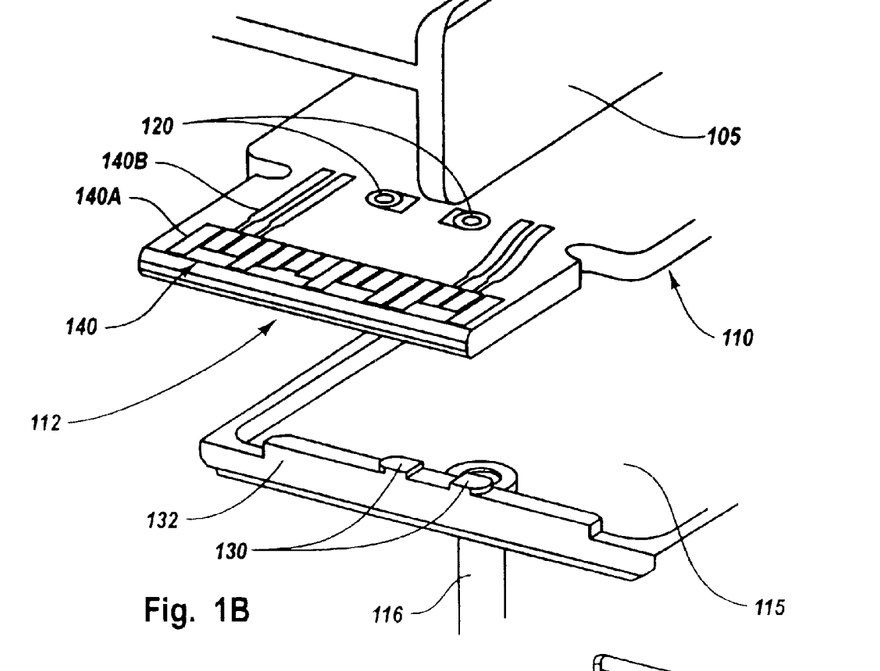
FIG. 1B is an exploded perspective view of the rear end of a transceiver module configured to contain EMI waves in accordance with one embodiment of the present invention.
Figure 1C:
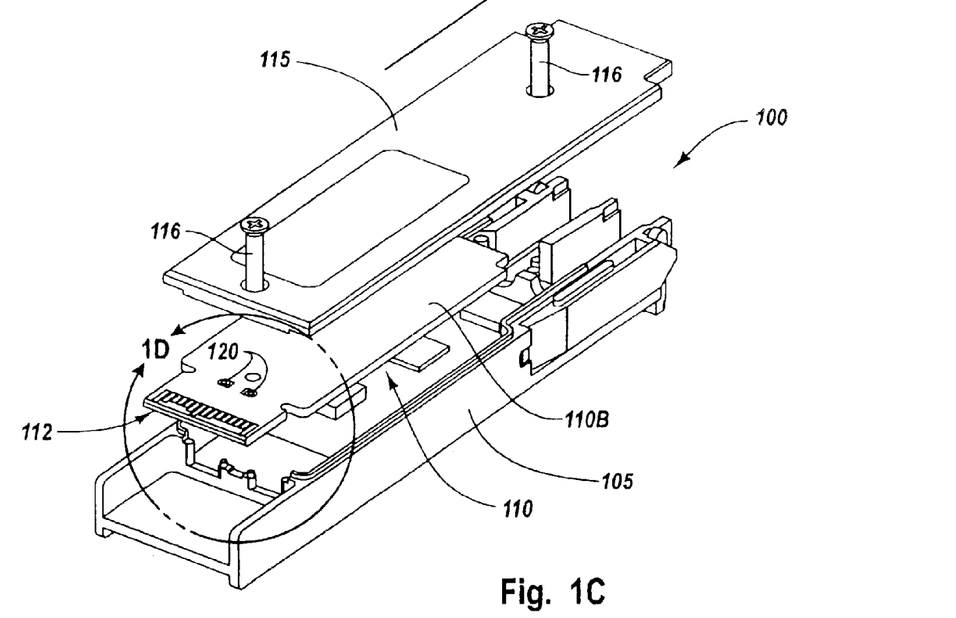
FIG. 1C is an exploded perspective view of the bottom side of a transceiver module configured to contain EMI waves in accordance with one embodiment of the present invention.
Figure 8A:
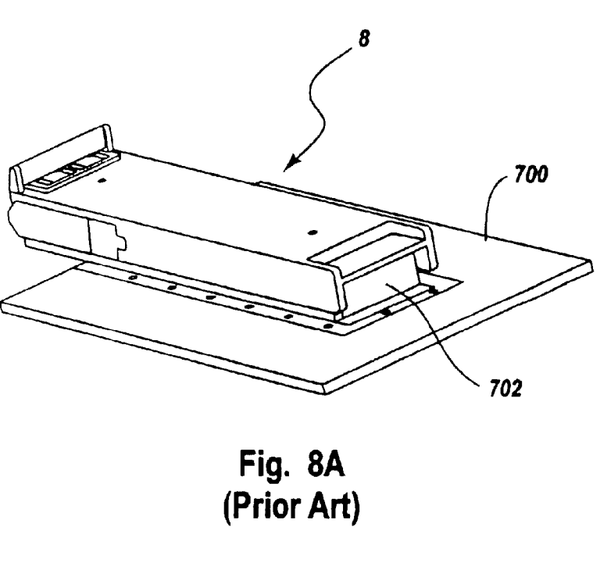
Figure 8B:
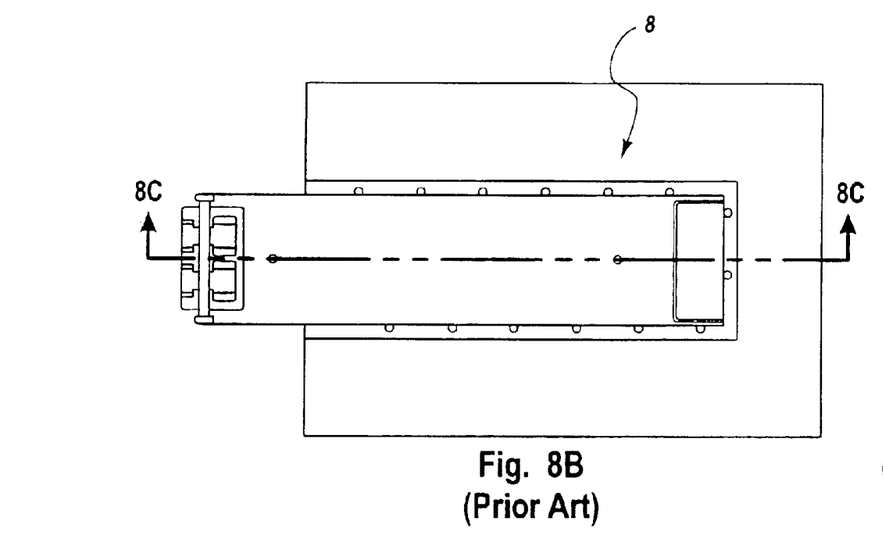
Figure 8C:
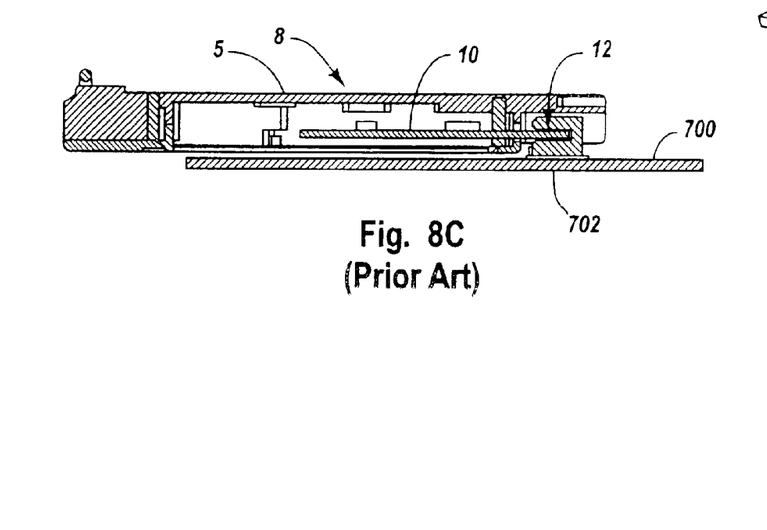

Reference is initially made to FIGS. 1A–1D and FIGS. 2A–2E, which together illustrate one presently preferred embodiment of a transceiver module, designated generally at 100. As shown in FIGS. 1A and 1C, the transceiver module 100 includes a top housing portion 105, a printed circuit board ("PCB") 110, and a bottom housing portion 115. The top and bottom housing portions 105, 115 are designed to fit together and form an interior portion containing a PCB 110 and associated electronic and optical components. A set of screws 116 (or any other appropriate fastening mechanism) are used to fasten the two housing portions 105, 115 together to form the outer shell, or outer housing 103, of the transceiver module 100. When joined together, the top and bottom housing portions 105, 115 also form a front opening 117 and a rear opening 118. The front opening 117 is designed to accept a modular plug (not shown) that is connected to two optical waveguides, one input waveguide and one output waveguide (not shown), the structure and implementation of which are well known in the art of optical communications. The rear opening 118 is designed to expose an electrical edge connector, denoted at 112, formed along one end of the PCB 110. The edge connector 112 is capable of being electrically and physically received within a corresponding connector (such as is shown in FIG. 8A at 702) that is typically mounted on a host board (700 in FIG. 8A) of an appropriate host device (not shown). The housing portions 105, 115 can include multiple holes or gaps that allow heat to escape from inside the transceiver module 100 during operation.

In a preferred embodiment, the top and bottom housing portions 105, 115 are at least partially composed of a conductive material so that when the housing portions are joined together, a shell of conductive material is formed about the periphery of the transceiver module 100. The conductive material on the housing portions 105, 115 form what is known as the chassis ground. A ground is an electrical pathway or drop through which voltage can pass. As discussed below, a ground can also have electromagnetic effects. The chassis ground is electrically isolated from all circuitry on the PCB 110.

Figures 2A, 2B, 2C, 2D, 2E:
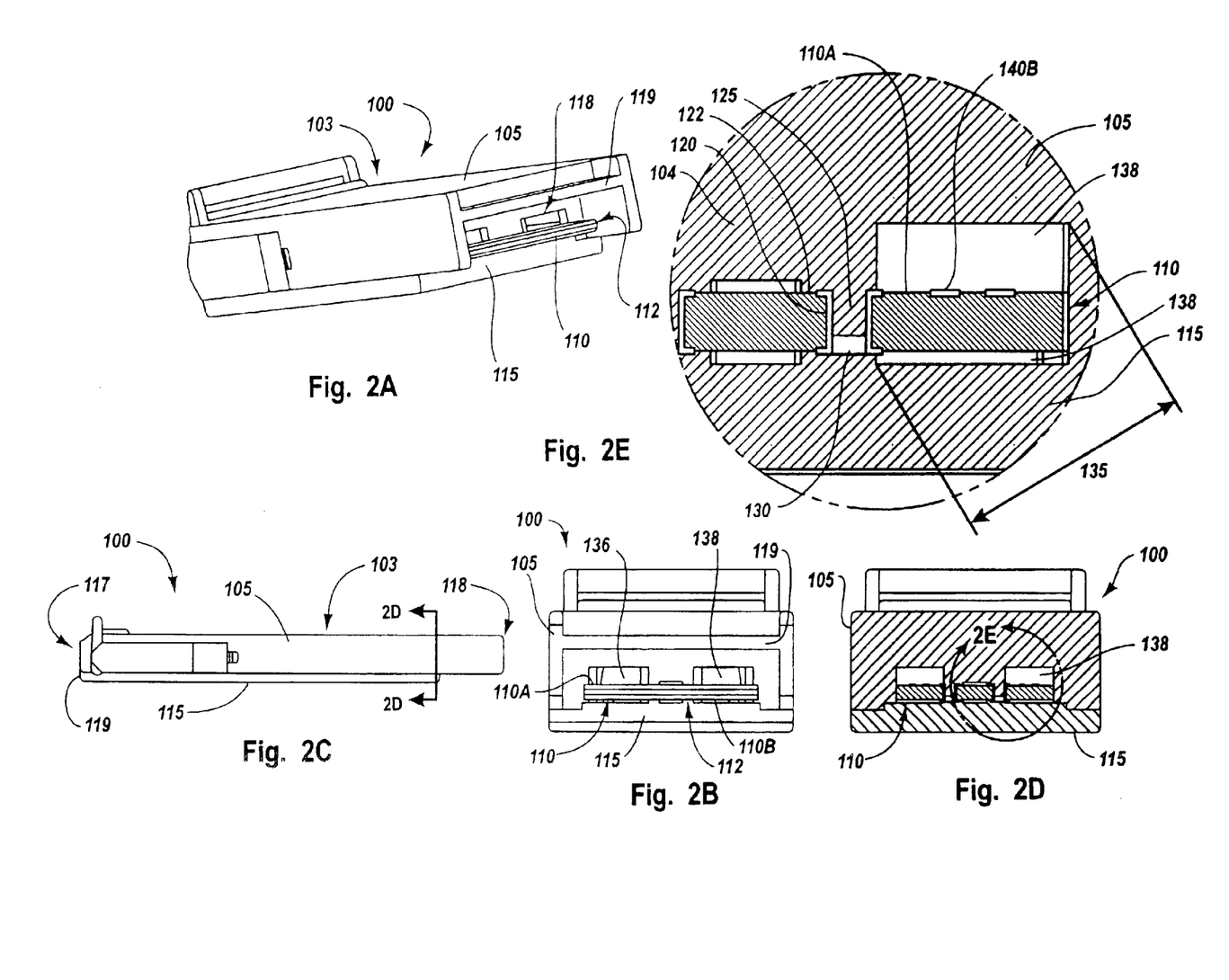
FIG. 2A is another perspective view of a transceiver module configured to contain EMI waves in accordance with one embodiment of the present invention.
FIG. 2B is a rear view of the transceiver module of FIG. 2A.
FIG. 2C is a side view of the transceiver module of FIG. 2A.
FIG. 2D illustrates a cutaway rear view taken along lines 2D—2D of FIG. 2C.
FIG. 2E illustrates a close up cutaway rear view taken along lines 2E in FIG. 2D.

As noted, the PCB 110 is substantially positioned within the interior portion formed between the top and bottom housing portions 105, 115. The top and bottom housing portions 105, 115 contain various support structures to securely support the PCB 110 when the two housing portions are joined together. FIGS. 2A–2C illustrate a completed transceiver module 100 in which the PCB 110 is securely positioned between the top and bottom housing portions 105, 115. The PCB 110 includes a top surface 110A oriented toward the top housing portion 105, and a bottom surface 110B oriented toward the bottom housing portion 115.

The PCB 100 further includes a plurality of high speed traces 140 that electrically transfer data from one location to another. Specifically, the PCB 100 includes edge traces 140A that are located on both the top and bottom surfaces 110A and 110B of the edge connector 112, and connecting traces 140B located on the surface of the top PCB surface. Because data are being transmitted at a very high frequency in an electrical form, potentially harmful EMI waves are generated within the transceiver module 100. The type of EMI waves that are allowed to leak out of the transceiver module 100 is dependent on the size and position of any opening present in the housing. Moreover, if the housing portions 105, 115 were not grounded, EMI would not be efficiently contained.

The largest opening present in the housing of a typical prior art transceiver module is located at the rear end of the housing, designated at 119, where the edge connector of the PCB 110 is exposed so as to electrically connect with a corresponding connector. As noted, the rear opening 118 located at the rear housing end 119 must provide a minimum clearance for the PCB 110 so as to not interfere with the electrical signals present on the high speed traces 140A and 140B communicating with the edge connector 112. In known devices, the largest opening distance is generally measured diagonally across an opening (denoted as the dimension "X" in FIG. 7C) because this is the longest one dimensional length of space available. The length of the largest opening is mathematically related to the frequencies of EMI waves that are allowed to leak out of the transceiver module. As data are transferred faster, the operating frequencies of the electrical components increase; thus the frequency of emitted EMI increases. Because frequency is inversely proportional to wavelength, the higher the frequency, the shorter the relative wavelength of the EMI waves that are generated by the high speed data. Therefore, in order to reduce the leakage of EMI waves generated from higher frequency data transmissions, the largest opening distance must be decreased. Unfortunately, the opening at the rear of the transceiver module cannot be entirely eliminated because of the high speed traces that are located on the surface of the PCB. As mentioned, there must be some space between the housing portions, which are grounded at chassis ground, and the conductive traces that pass through rear opening of the transceiver module in order to avoid signal degradation of the signals passing through the traces.

Continuing reference is made to FIGS. 1A–2E. Embodiments of the present invention provide a means for reducing the size of the opening, thereby minimizing the amount of EMI that can escape therethrough. For example, in the illustrated embodiment, the PCB 110 includes at least two holes that extend through the entire thickness of the board designated at 110. The holes are lined with a conductive material to form electrically conductive vias 120. FIG. 2E illustrates how the holes are lined to create the vias 120. The vias 120 are formed in the board 110 in a manner as to be electrically isolated from the remainder of the circuitry on the PCB 110. As will be seen, the conductive vias 120 enable a "chassis ground fence" to be created adjacent the rear housing end 119 in order to reduce the emission of EMI from the interior of the transceiver module 100.

Figure 1D:
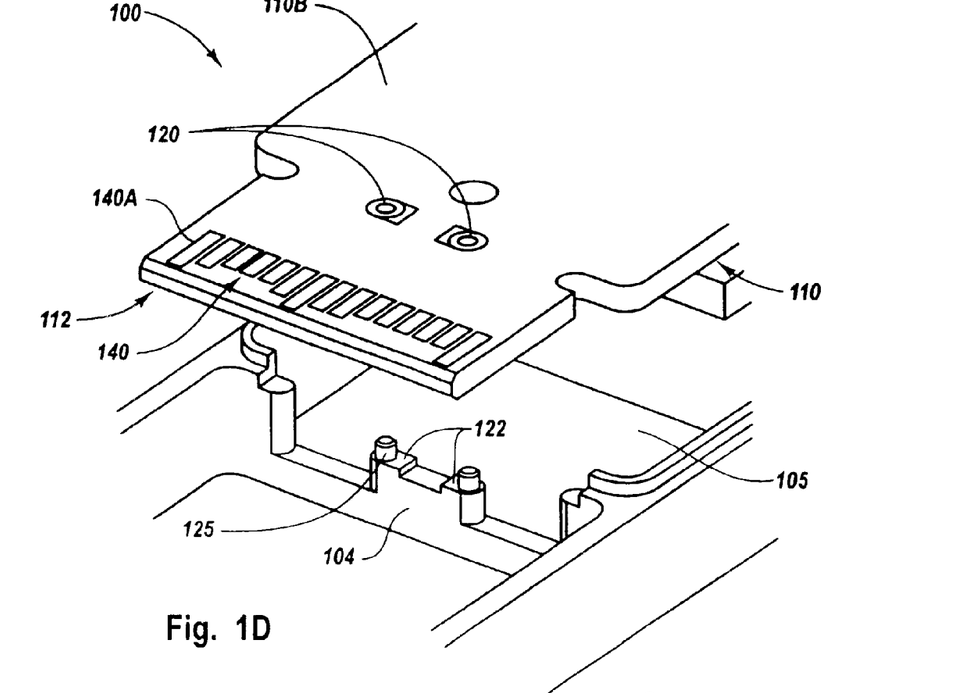
FIG. 1D is an exploded perspective view of the bottom side of the rear end of a transceiver module configured to contain EMI waves in accordance with one embodiment of the present invention.

In the illustrated embodiment, the top housing portion 105 includes a raised structure 104 located at the rear housing end 119 adjacent the rear opening 118. As best seen in FIG. 1D, the raised structure 104 includes two posts 125 oriented toward the bottom housing portion 115. The posts 125 are positioned to be received within the holes defining the conductive vias 120 when the top and bottom housing portions 105, 115 are joined together. Thus, the posts 125 serve to align the PCB 110 with respect to the top housing 105. With the posts 125 aligned with and partially received into the conductive vias 120, two plates 122 formed on the raised structure 104 of the top housing portion 105 are brought into contact with conductive portions on the outer periphery of the conductive vias 120. The plates 122 are formed of an electrically conductive material that enables them to electrically connect with the conductive vias 120 and to contribute in establishing chassis ground when the top and bottom housings 105, 115 are joined together, as will be seen. This arrangement is best seen in FIG. 2E, which shows the plates 122 in electrical contact with the conductive plating of vias 120, thereby establishing electrical contact between vias 120 and top housing 105.

As best seen in FIGS. 1B and 2E (in cross section), the bottom housing 115 includes two plates 130 that are positioned on a ridge 132 of the bottom housing as to be aligned with the conductive vias. In this alignment, the plates 130 are positioned such that they physically contact the exterior periphery of the conductive vias 120 when the top and bottom housing portions 105 and 115 are joined. The plates 130 are also composed of a conductive material and are electrically connected to the bottom housing 115. This enables the plates 130 to participate in conducting chassis ground between the top and bottom housing portions 105 and 115 when the housing portions are joined, as shown in FIG. 2A. The plates 122 of the top housing portion 105 and the plates 130 of the bottom housing portion 115 are positioned such that they only electrically connect with the vias 120 and are electrically isolated from all other circuitry on the PCB 110.

In greater detail, because the plates 122 of the top housing 105 are electrically connected to the conductive vias 120 defined in the PCB 110, and the vias are electrically connected to the plates 130, the top housing 105 is in indirectly and electrically connected to the bottom housing 115 by way of a conductive pathway that extends through the conductive vias and each set of plates when the housing portions are clamped into contact with one another. Thus, a chassis ground present at one or both of the housing portions 105, 115 is extended through the conductive pathway, as just described. The extension of chassis ground through this conductive pathway creates what is referred to herein as a "chassis ground fence." As explained below, this chassis ground fence reduces the escape of EMI from the transceiver module, thereby improving the performance of the transceiver.

FIG. 2E illustrates a close-up cross sectional view of a portion of the chassis ground fence. Accordingly, this figure shows one post 125, one plate 122, one complete conductive via 120, and one plate 130 as arranged when the top and bottom housing portions 105 and 115 are joined to form the transceiver module housing. The physical connection between these components is evident in the figure, thereby giving rise to the electrical connection between the top housing portion 105 and the bottom housing portion 115.

As can be seen from FIGS. 2A–2E, the rear opening 118 of the rear housing end 119 is divided and reduced in dimension as a result of the presence of the chassis ground fence defined by the posts 125, plates 122, conductive vias 120, and plates 130. Specifically, these structures introduce portions of the chassis ground through formerly open area defined by the rear opening 118 (see, in comparison, dimension "X" in FIG. 6B) to define two reduced dimension openings 136 and 138. Because of the chassis ground fence and the corresponding reduction in the overall dimension of the rear opening 118, EMI is unable to effectively penetrate the rear housing end 119 through the reduced dimension openings 136. This in turn reduces EMI emission from the transceiver module 100 and prevents interference with operation of either the transceiver or other nearby components. The reduced dimension openings 136 and 138 remain sufficiently sized to allow the connecting traces 140B to pass through without affecting the quality of the signals they carry.

It will be appreciated that the specific configuration of the chassis ground fence defined by the above components can be varied while still providing the desired EMI protection. For instance, the number of plate-via-post-plate combinations can be varied to increase or decrease both the number and size of the reduced-dimension openings at the rear housing end 119. Additionally, the presence, particular shape, and configuration of the raised structure 104 of the top housing 105, as well the ridge 132 supporting the plates 103 of the bottom housing 115 can also be modified as desired to achieve optimum function. In one embodiment, for instance, the height of the raised structure 104 can be altered in order to vary the clearance provided between the top housing 105 and the surface of the PCB 110 on which the connecting traces 140B are located. These and other changes to the chassis ground fence are complicated.

As seen in FIG. 2E, though they align with and may be in electrical contact with the conductive vias 120, the posts 125 in the illustrated embodiment do not completely extend through the vias to directly contact any portion of bottom housing 115. Indeed, direct contact between the posts 125 and the bottom housing 115 is not necessary to extend chassis ground between the top and bottom housing portions 105 and 115. Rather, chassis ground in the illustrated embodiment extends along multiple paths comprising one each of the plates 122, conductive vias 120 and plates 130. If desired, however, each post 125 can be configured in one embodiment to electrically connect with the respective conductive via 120 into which it is received, thereby contributing to the provision of chassis ground between the top and bottom housings 105, 115.

In view of the above discussion, it is seen that the combination of the plates 122, the conductive vias 120, the posts 125, and the plates 130 serve as one means for electrically connecting the top and bottom housing portions 105 and 115 while reducing the area of EMI emission at an end of the transceiver module 100 proximate the edge connector 112. However, it is appreciated that other means can be also employed to achieve this same functionality. For example, alternative structures, such as conductive foams and springs, could be utilized in establishing an electrical chassis ground connection between the top housing 105 and the bottom housing 115. These alternative embodiments, in addition to other embodiments to be explicitly described below, are therefore contemplated within the claims of the present invention.

Reference is next made to FIGS. 3A–3D and FIGS. 4A–4E, which illustrate a transceiver module, designated generally at 200, configured in accordance with another embodiment of the present invention. The transceiver module 200 includes many of the same components as the embodiment described in detail with reference to FIGS. 1A–1D and FIGS. 2A–2E, and to the extent that common features are shared between them, some of these features will not be discussed. As shown in the figures, the module 200 includes a top housing portion 205, a bottom housing portion 215, and a PCB 210. As described above, the top and bottom housing portions 205, 215 fit together to form an outer housing 203 that at least partially encloses the PCB 210. In addition, this outer housing 203 carries an electrical chassis ground around the PCB 210 in the same manner as described above. Extending from a rear housing end 219 of the module 200 is an edge connector 212 portion of the PCB 210. The edge connector 212 includes a plurality of conductive edge traces 240A in communication with connecting traces 240B for transferring electrical data signals between the module 200 and a host device (not shown) that interfaces with the edge connector.

In the illustrated embodiment, the PCB 210 further includes two holes 220 formed through the PCB. Unlike the embodiment described above, the holes 220 are not lined with any conductive material but are simply formed through the dielectric material comprising the PCB 210. The holes 220 are located substantially adjacent the edge connector 212 portion of the PCB 210.

Figures 3A, 3B:
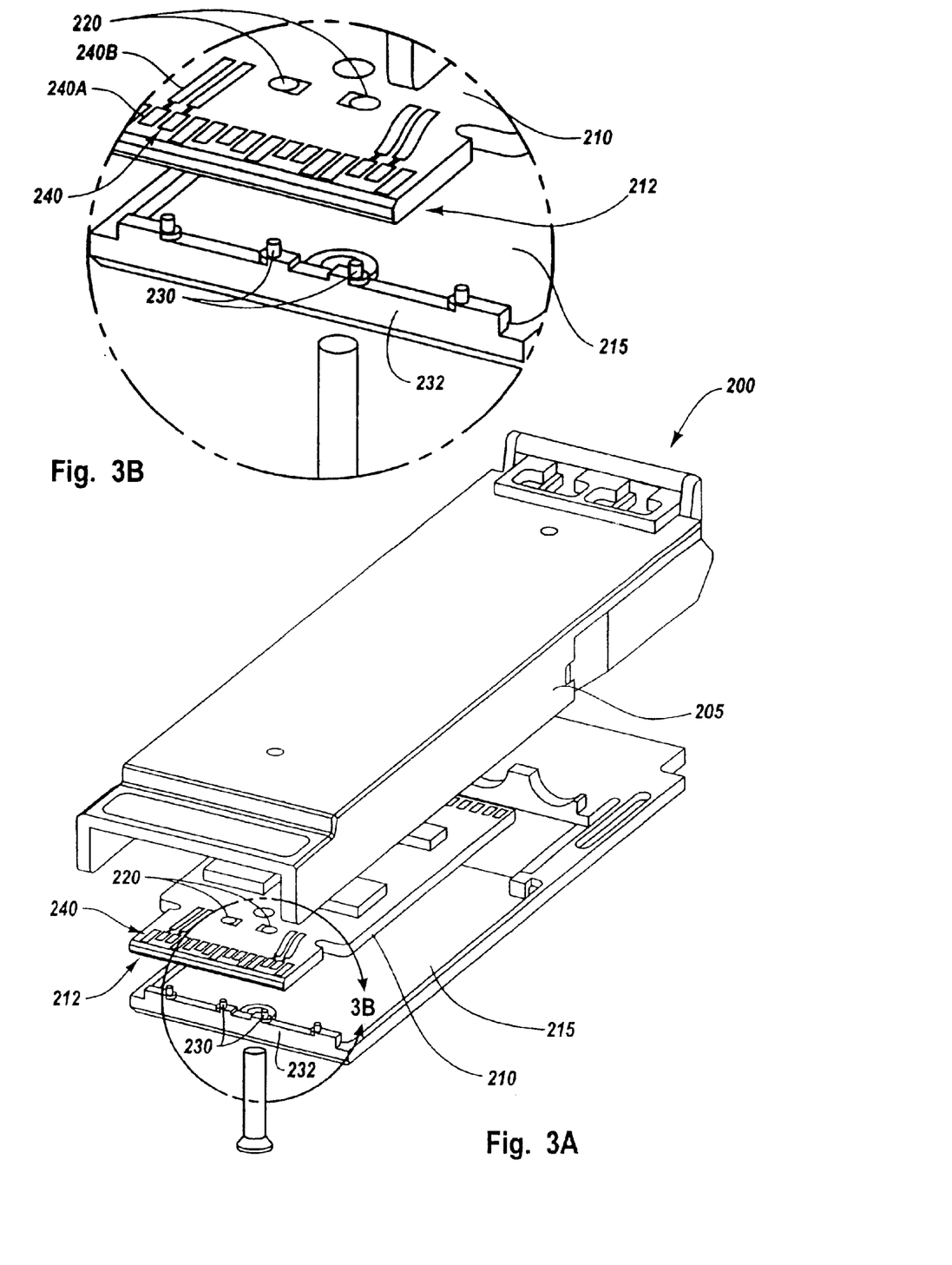
FIG. 3A illustrates an exploded view of another embodiment of a transceiver module.
FIG. 3B is an exploded view showing additional details of the rear end of the transceiver module of FIG. 3A.
Figure 3A:
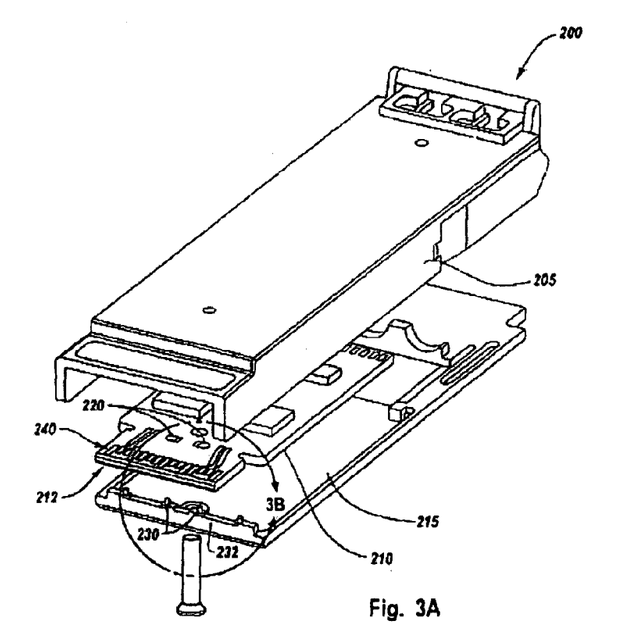
Figures 3C, 3D:
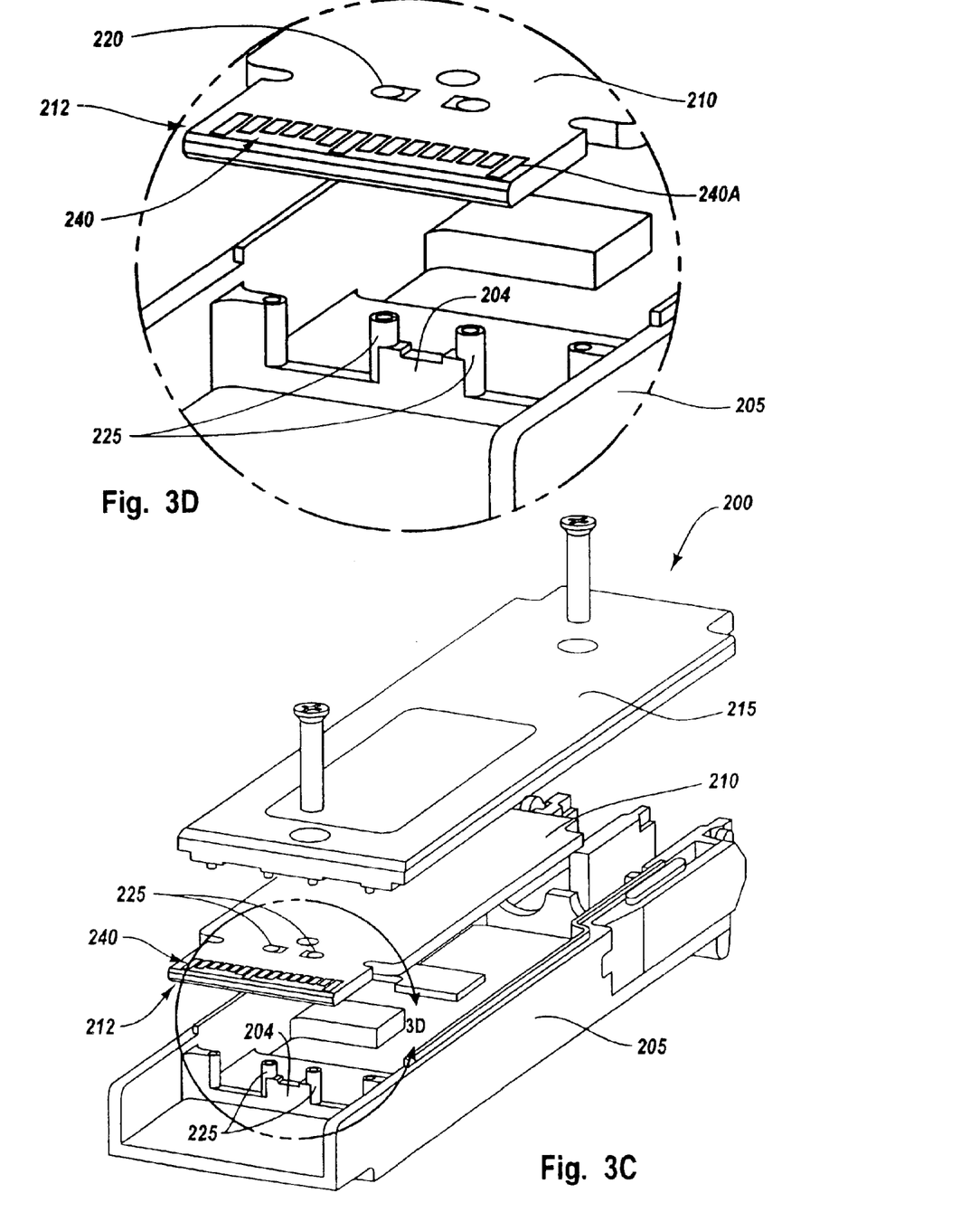
FIG. 3C is an exploded perspective view of the bottom of the transceiver module of FIG. 3A.
FIG. 3D is an exploded view of the rear end of the transceiver module of FIG. 3A.
Figure 3C:
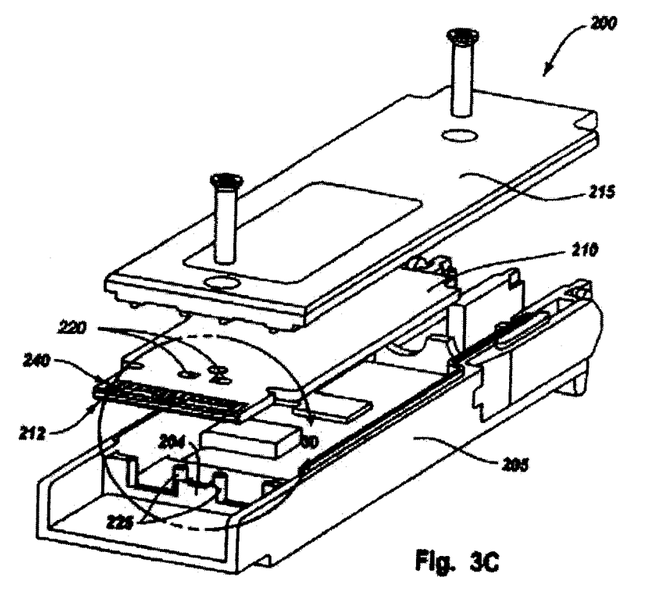
Figures 4A, 4E:
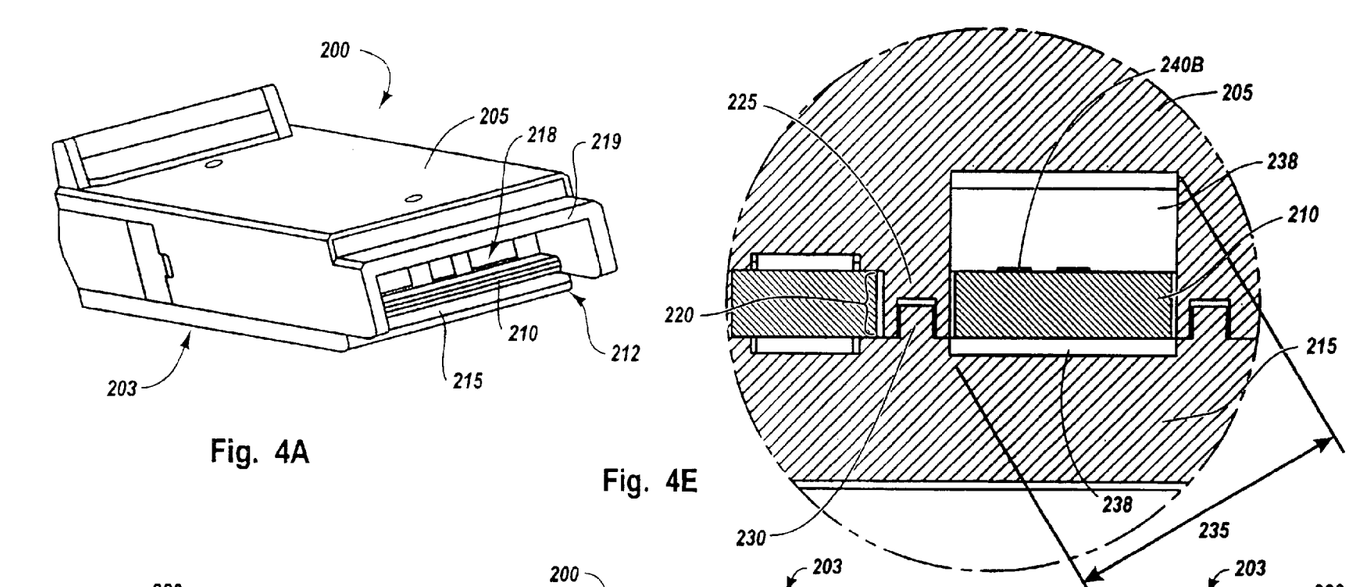
FIG. 4A is another perspective view of the transceiver module of FIG. 3A.
FIG. 4E is a close up cutaway view of the transceiver module taken along lines 4E in FIG. 4D.
Figure 4B:
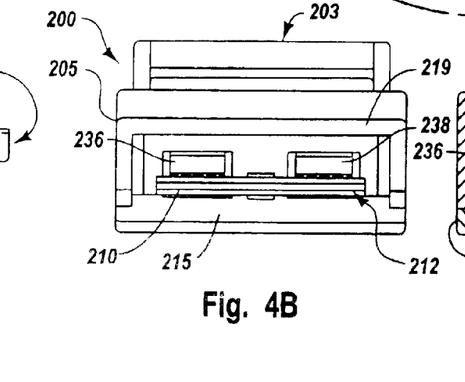
FIG. 4B is a rear view of the transceiver module of FIG. 4A.
Figure 4C:
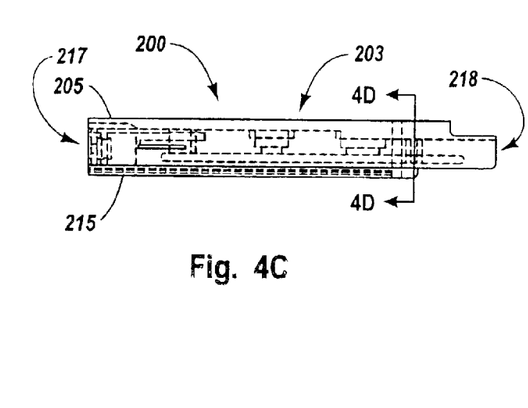
FIG. 4C is a side view of the transceiver module of FIG. 4A.
Figure 4D:
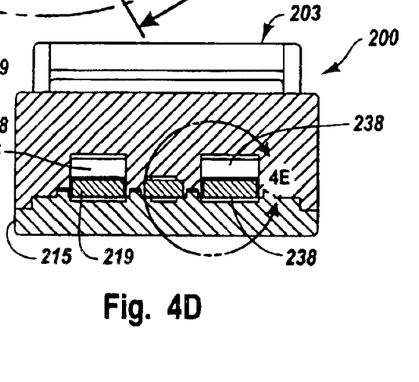
FIG. 4D is a cutaway rear view of the transceiver module taken along lines 4D—4D in FIG. 4C.

The top housing portion 205 includes two bosses 225, best seen in FIGS. 3C and 3D, that are positioned on a raised structure 204 of the top housing 205 so as to be received within the corresponding holes 220 when the top and bottom housing portions 205 and 215 are joined together. Specifically, FIGS. 3D and 4E illustrate how the sockets 225 are received within the holes 220. Each socket 225 is composed of an electrically conductive material and is electrically connected to the top housing 205. In this way, the sockets 225 are connected to chassis ground when the top housing portion 205 is chassis grounded.

The bottom housing portion 215 includes two pins 230 positioned on a ridge 232 that are to be partially received within the holes 220 defined in the PCB 210. In particular, the pins 230 are configured as to be received within corresponding sockets formed in the ends of the bosses 225 when the top and bottom housing portions 205, 215 are joined together. This is best shown in FIG. 4E. Like the bosses 225, the pins 230 are also composed of an electrically conductive material and are electrically connected to the bottom housing portion 215 so that the pins are connected to chassis ground when the bottom housing portion 215 is chassis grounded.

The alignment described above enables the holes 220, bosses 225, and pins 230 to form electrically conductive paths between the top and bottom housings 205 and 215 when the housing portions are joined together. In particular, when the housing portions 205 and 215 are joined, each pin 230 partially passes through the corresponding hole 220 and is received into the socket formed in the corresponding boss 225 (the boss also being partially received by the hole) such that the pin and boss are electrically connected. Because it is not plated with a conductive material, the hole 220 does not contribute to the electrical connection between the pin 230 and the boss 225 in contrast to the previous embodiment, but rather merely provides space for them to connect. As such, the PCB 210 and any circuitry located thereon are electrically isolated from any of the bosses 225 or pins 230.

As was the case with the previous embodiment, when the top and bottom housing portions 205, 215 are joined together, the electrically conductive paths established therebetween via the boss-hole-pin configuration form multiple chassis ground paths between the housing portions when one or both housing portions are chassis grounded. As before, the chassis ground passes through the PCB 210 between the top and bottom housings 205 and 215 via the boss-hole-pin configuration to form a chassis ground fence. Again, as with the previous embodiment, the chassis ground fence reduces the overall size of the opening (i.e., rear opening 218) at the rear housing end 219 by sub-dividing it into smaller-dimensioned openings, designated at 236 and 238. The openings 236 and 238 are sufficiently sized as to enable the connecting traces 240B to pass therethrough without impairing the signals they carry. FIG. 4E illustrates the maximum dimension of one of the openings, opening 238, as comprising a distance 235. As can be seen in comparison with the opening 20 of the prior art transceiver shown in FIG. 6B, the dimension 235 of the opening 238 is substantially smaller than dimension X of the opening 20. As before, this relatively reduced dimension of the openings 236 and 238 at the rear housing end 219 results in reduced EMI emissions escaping from the rear housing end of the transceiver module 200. Again, absent the two sets of holes 220, sockets 225, and pins 230, the opening distance would span an area much greater than that defined by the two reduced dimension openings 236, 238, thereby undesirably increasing the area of escape for EMI. As before, it should be remembered that the particular hole-boss-pin configuration shown in the present embodiment is merely exemplary of the structure that can be utilized in providing a chassis ground fence for containing EMI in a transceiver module. Other configurations that preserve this function are also contemplated. Additionally, it is appreciated that the chassis ground fence concept can be extended to areas of the transceiver module other than the rear housing end, if desired.

Figure 5A:
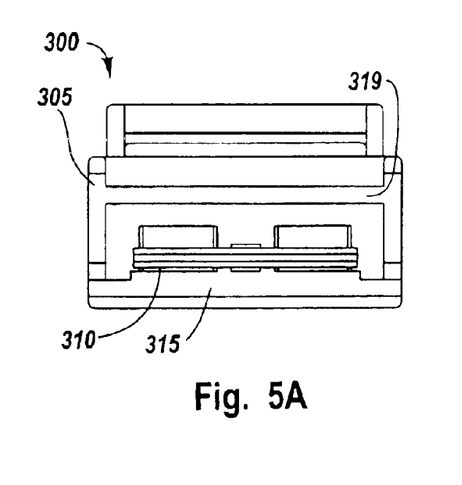
FIG. 5A is an end view of a transceiver module configured in accordance with another embodiment of the present invention.
Figure 5B:
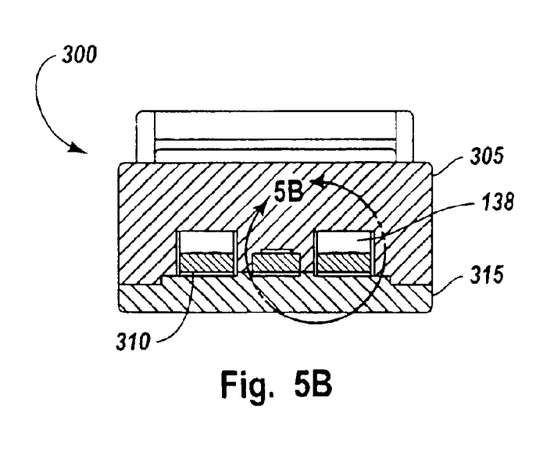
FIG. 5B is a close-up cut away view of the transceiver module taken along lines 5B in FIG. 5A.
Figure 5C:
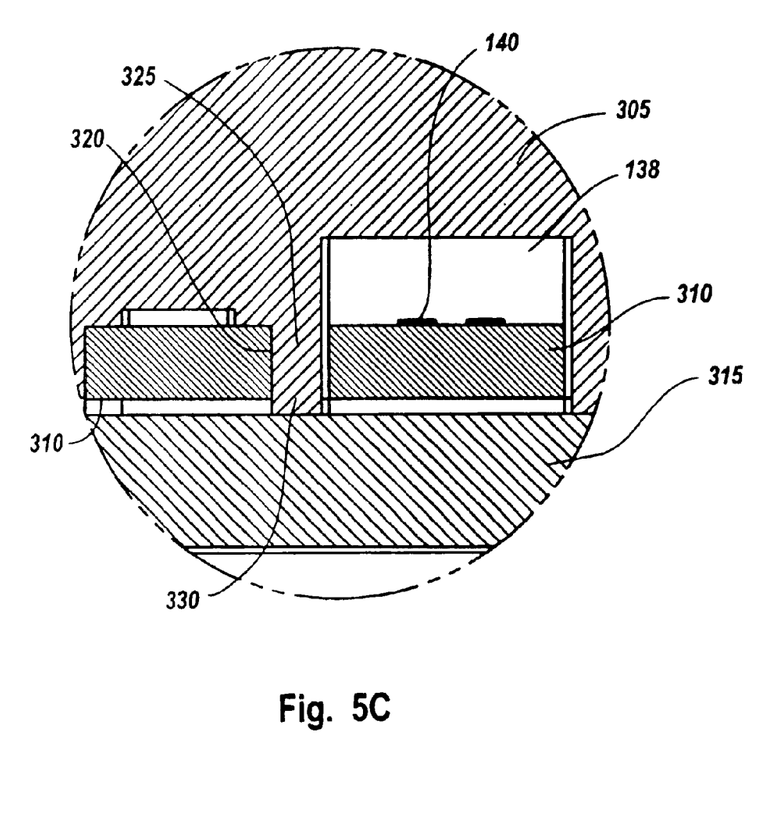

Reference is now made to FIGS. 5A–5B, which illustrate yet another embodiment of the present invention. Again, to the extent that common features are shared between this and previous embodiments, some of these features will not be discussed. FIGS. 5A and 5B include views of a portion of an optical transceiver module 300 having top and bottom housing portions 305 and 315, respectively. The top and bottom housing portions 305 and 315 together form the transceiver housing, which contains a PCB 310. Similar to the previous embodiment, the PCB 310 includes two holes 320 defined therethrough near an end thereof, the end being located substantially adjacent a rear housing end 319 of the transceiver module 300. The holes 320 are not lined with a conductive material and are aligned to each receive a post 325 extending from and electrically connected to a portion of the top housing portion 305. Each post 325 extends through the respective hole 320 and contacts a portion of the bottom housing portion 315, in this case, one of two plates 330, which are electrically connected with the bottom housing portion.

The engagement of each post 325 with the respective plate 330 creates a conductive path that electrically connects the top housing portion 305 to the bottom housing portion 315. Further, this connection enables chassis ground to be extended through the conductive path, thereby forming a chassis ground fence at the rear housing end 319 of the transceiver module 300, as in previous embodiments. In contrast to previous embodiments, however, each post 325 completely extends through the respective hole 320 of the PCB 310 to contact the respective plate 330 of the bottom housing portion 315. In other embodiments, the post 325 can extend through the hole 325 and directly contact a flat surface of the bottom housing portion 315, thereby obviating the need for the plate 330. Or, in yet another embodiment, the post-hole-plate configuration can be modified by plating each hole 320 with a conductive plating similar to that found in the embodiment illustrated in FIGS. 1A–2E, further enhancing the electrical contact between the housing portions. The present embodiment, in addition to the previous and following embodiments, therefore serves as another example of a means for electrically connecting the top and bottom housing portions with chassis ground as to reduce the area of emission of electromagnetic interference from an end of the transceiver module.

Reference is next made to FIGS. 6A–6B, which illustrate a printed circuit board, designated generally at 500, configured in accordance with yet another embodiment of the present invention. The printed circuit board 500 in this embodiment is designed to fit within the housing of a transceiver module. However, the EMI reduction modifications are implemented on the printed circuit board 500 alone. Therefore, the printed circuit board 500 described in this embodiment can be utilized with existing unmodified housings of the same form factor to form a complete transceiver module. The printed circuit board 500 includes high speed edge traces 520 positioned on the edge connector portion 512 of the printed circuit board 500. The high speed edge traces 520 are electrically connected to embedded traces 525 that tunnel through the dielectric material within the printed circuit board and are then electrically connected to median traces 530. The median traces 530 are positioned on the surface of the printed circuit board 500 like the high speed edge traces 520 as illustrated in FIG. 6A. The printed circuit board 500 further includes two electrical vias 535. The electrical vias 535 are narrow holes that extend through the entire printed circuit board 500 that are filled with an electrically conductive material. The vias 535 are electrically isolated from all other circuitry on or within the printed circuit board 500. These vias 535 provide a connection point to the module housing such that a chassis ground can extend through the printed circuit board. Only one side of the vias 535 need be electrically connected to the housing in order to encircle the embedded traces 525 with the chassis ground because of an embedded ground layer 540, described below.

The cut-away view illustrated in FIG. 6B shows how the printed circuit board further includes an embedded ground layer 540 that encircles the embedded traces 525. The embedded ground layer 540 is electrically connected to the vias 535 in order to carry the chassis ground from the housing. The embedded ground layer 540 is a conductive material that is embedded within the printed circuit board in the manner shown in FIG. 6B. By incorporating this embedded ground layer 540 that carries the chassis ground, particular EMI waves generated within the housing are effectively prevented from leaking out. The printed circuit board 500 in this embodiment is designed to fit within a housing that completely eliminates a rear opening by actually touching the printed circuit board 500 at a lateral location between the high speed edge traces 520 and the vias 535. Since all electrical data within this region is transferred through the embedded traces 525, it is possible for the housing to physically contact the printed circuit board (completely eliminating the open space that commonly allows EMI waves to leak out) without electrically interfering with the transference of data. As described above, the vias 535 can be equipped with conductive devices known in the art to ensure that an electrical connection between the vias 535 and the housing (not shown) is established, such as a conductive foam or spring. In addition, the embedded ground of this embodiment can be combined with the interconnection schemes of the previous embodiments to provide a different electrical connection between the printed circuit board 500 and the housing (not shown).

In one embodiment, in order to further facilitate reliable electrical connection between the top housing and the vias 535 and between the bottom housing and the vias 535, a conductive band 550 can be formed around the surface of the PCB 500, as illustrated in FIGS. 6A and 6B. The thickness of the conductive band 550 is exaggerated in FIG. 6B for purposes of visibility in the illustration. The conductive band 550 both establishes a conductive ground path around the PCB and also enhances the electrical connection with the top and bottom housings. This conductive band or strip 550 is particularly useful in establishing a reliable electrical connection with springs or foam EMI gaskets that can be used with the top and bottom housing.

In summary, the present invention relates to a module design that reduces the leakage of particular EMI waves by passing a ground through or piercing a PCB that is within a grounded housing. The piercing ground does not affect any of the circuitry on the PCB but has the effect of minimizing the size of any openings through which EMI can escape. The teachings of the present invention are applicable to any electrical module that potentially generates high frequency data that causes potentially harmful EMI waves.

The present invention may be embodied in other specific forms without departing from its spirit or essential characteristics. The described embodiments are to be considered in all respects only as illustrative and not restrictive. The scope of the invention is, therefore, indicated by the claims rather than by the foregoing description. All changes which come within the meaning and range of equivalency of the claims are to be embraced within their scope.

What is claimed is:

1. An electronic module, comprising:
  a housing including electrically conductive top and bottom housing portions in substantial contact with each other and cooperating with each other to define an opening; and
  a printed circuit board ("PCB") substantially disposed within the housing and defining at least one non-conductive through opening configured and arranged so that the housing portions contact each other by way of the at least one non-conductive through opening and cooperate to subdivide the opening defined by the housing into a plurality of relatively smaller openings.

2. The electronic module as recited in claim 1, wherein the at least one non-conductive through opening comprises a plurality of non-conductive through openings.

3. The electronic module as recited in claim 1, wherein one of the housing portions includes a post and the other housing portion includes a plate, the post extending through the at least one non-conductive through opening so as to contact the plate.

4. The electronic module as recited in claim 1, wherein each of the relatively smaller openings has a geometry that is related to a frequency of electromagnetic radiation associated with the electronic module.

5. The electronic module as recited in claim 1, wherein the PCB includes an edge connector located proximate the opening defined by the housing.

6. The electronic module as recited in claim 1, further comprising at least one fastener joining the top and bottom housing portions together, the at least one fastener passing through a non-conductive opening defined by the PCB.

7. An optical transceiver module, comprising:
  an optical transmitter;
  an optical receiver;
  a housing including electrically conductive top and bottom housing portions in substantial contact with each other and cooperating with each other to define an opening, and the housing substantially enclosing the optical transmitter and the optical receiver; and
  a printed circuit board ("PCB") substantially disposed within the housing and being in communication with the optical transmitter and the optical receiver, and the PCB defining at least one non-conductive through opening configured and arranged so that the housing portions contact each other by way of the at least one non-conductive through opening.

8. The optical transceiver module as recited in claim 7, wherein the optical transceiver module substantially conforms with one of: the SFP MSA; and, the XFP MSA.

9. The optical transceiver module as recited in claim 7, wherein one of the housing portions includes a post and the other housing portion includes a plate, the post extending through the at least one non-conductive through opening so as to contact the plate.

10. The optical transceiver module as recited in claim 7, wherein the PCB includes an edge connector located proximate the opening defined by the housing.

11. The optical transceiver module as recited in claim 7, wherein the opening defined by the housing is subdivided into a plurality of relatively smaller openings as a result of the contact between the housing portions that occurs by way of the at least one non-conductive through opening.

12. The optical transceiver module as recited in claim 11, wherein each of the relatively smaller openings has a geometry that is based at least in part upon a frequency of electromagnetic radiation associated with the optical transceiver module.

13. An electronic module, comprising:
  a housing including electrically conductive top and bottom housing portions in substantial contact with each other and cooperating with each other to define an opening;

a printed circuit board ("PCB") substantially disposed within the housing and including an edge connector that extends at least partially through the opening in the housing and that includes a plurality of high speed traces, and the PCB defining at least two non-conductive through openings configured and arranged so that the housing portions contact each other by way of the at least two non-conductive through openings and subdivide the opening defined by the housing into at least two relatively smaller openings; and at least one fastener joining the top and bottom housing portions together, the at least one fastener passing through a non-conductive opening defined by the PCB.

14. The electronic module as recited in claim 13, wherein one of the housing portions includes a pair of posts and the other housing portion includes a pair of plates, each of the posts extending through a respective non-conductive through opening of the PCB so as to contact a respective plate.

15. The electronic module as recited in claim 13, wherein the pair of posts are attached to the upper housing portion, and the pair of plates are attached to the lower housing portion.

16. An optical transceiver module, comprising:

an optical transmitter;

an optical receiver;

a housing including electrically conductive top and bottom housing portions in substantial contact with each other and cooperating with each other to define an opening, one of the housing portions including a pair of posts and another of the housing portions including a pair of plates, and the housing substantially enclosing the optical transmitter and the optical receiver;

a printed circuit board ("PCB") substantially disposed within the housing and in communication with the optical transmitter and the optical receiver, the PCB including an edge connector that extends at least partially through the opening in the housing, and the PCB defining at least two non-conductive through openings configured and arranged so that each post of one housing portion extends through a respective non-conductive through opening and contacts a respective plate of the other housing portion.

17. The optical transceiver module as recited in claim 16, wherein the optical transceiver module substantially conforms with one of: the SFP MSA; and, the XFP MSA.

18. The optical transceiver module as recited in claim 16, wherein the posts and plates cooperate to subdivide the opening defined by the housing into a plurality of relatively smaller openings.

19. The optical transceiver module as recited in claim 18, wherein each of the relatively smaller openings has a geometry that is based at least in part upon a frequency of electromagnetic radiation associated with the optical transceiver module.

20. The optical transceiver module as recited in claim 16, further comprising at least one fastener joining the top and bottom housing portions together, the at least one fastener passing through a non-conductive opening defined by the PCB.

21. The optical transceiver module as recited in claim 16, wherein the pair of posts are attached to the upper housing portion, and the pair of plates are attached to the lower housing portion.

* * * * *

UNITED STATES PATENT AND TRADEMARK OFFICE
CERTIFICATE OF CORRECTION

Page 1 of 2

PATENT NO. : 7,068,522 B2
APPLICATION NO. : 10/831595
DATED : June 27, 2006
INVENTOR(S) : Aronson et al.

It is certified that error appears in the above-identified patent and that said Letters Patent is hereby corrected as shown below:

Drawings
Delete drawing sheet 3A and substitute therefor the drawing sheets, consisting of fig. 3A as shown below.

Fig. 3A

Signed and Sealed this
Eighth Day of March, 2011

David J. Kappos
*Director of the United States Patent and Trademark Office*

CERTIFICATE OF CORRECTION (continued)
U.S. Pat. No. 7,068,522 B2

Replace Fig. 3C with the figure depicted herein below, wherein one of the references of "225" has been changed to --220--

Fig. 3C

Column 2
Line 44, change "6B" to --7C--
Line 48, change "6B" to --7C--

Column 6
Lines 23, change "designated at 110" to --.--

Column 7
Line 36, change "6B" to --7C--
Line 57, change "well the ridge" to --well as the ridge--

Column 9
Line 47, change "6B" to --7C--
Line 66, change "5B" to --5C--

Column 10
Line 3, change "5A and 5B" to --5A-5C--
Line 30, change "325" to --320--